United States Patent [19]

Rauch

[11] 4,142,464

[45] Mar. 6, 1979

[54] SCREEN PRINTING AND STENCIL ARTICLES, APPARATUS AND METHODS

[76] Inventor: Georg Rauch, 1 Vista de Catalina, South Laguna, Calif. 92677

[21] Appl. No.: 741,597

[22] Filed: Nov. 15, 1976

[51] Int. Cl.² ............................................. B41M 1/24
[52] U.S. Cl. .................. 101/128.3; 96/36.4; 96/78; 96/201; 101/128.4
[58] Field of Search .................. 101/127, 127.1, 128.1, 101/128.2, 128.3, 128.4, 473, 401.1; 96/36.4, 201, 75, 78, 85; 427/143; 156/312; 40/158 B, 158 R; 355/113, 118, 122-129, 131-133

[56] References Cited

U.S. PATENT DOCUMENTS

| | | | |
|---|---|---|---|
| 1,240,344 | 9/1917 | Ives | 96/75 |
| 1,828,955 | 10/1931 | Bornmann | 96/78 X |
| 2,569,752 | 10/1951 | Fowler | 101/128.3 |
| 3,507,651 | 4/1970 | Wrench | 101/128.3 X |
| 3,676,128 | 7/1972 | Leopold et al. | 101/128.3 X |
| 3,865,589 | 2/1975 | Freeman et al. | 96/85 X |
| 3,891,441 | 6/1975 | Tsuji et al. | 101/128.3 X |
| 3,894,487 | 7/1975 | Miller | 101/127 X |
| 3,897,587 | 7/1975 | Molner | 40/158 B |
| 3,987,725 | 10/1976 | Scantlin | 101/128.4 |

FOREIGN PATENT DOCUMENTS

| | | | |
|---|---|---|---|
| 552962 | 2/1958 | Canada | 355/118 |
| 1934410 | 1/1970 | Fed. Rep. of Germany | 101/128.4 |

*Primary Examiner*—Ronald E. Suter
*Attorney, Agent, or Firm*—Benoit Law Corporation

[57] ABSTRACT

Screen printing and stencil articles, apparatus and methods provide a stencil including a screen and photosensitive emulsion for selectively stopping areas of the screen upon photographic exposure and development. One or more sheets are adapted to receive an image pattern through which the photosensitive emulsion is to be exposed. The photosensitive emulsion is shielded against spurious exposure. The screen with shielded photosensitive emulsion and the one or more pattern receiving sheets are combined into a unitary stencil making assembly.

A stencil comprises a rectangular screen having meshes. A first area on the screen is stopped and a second area adjacent the first area comprises open meshes of the screen. A first elongate screen mounting member is attached to and extends along a first side of the screen. A second elongate screen mounting member is attached to and extends along an opposite second side of the screen. The screen itself is self-supporting between the first and second mounting members.

76 Claims, 26 Drawing Figures

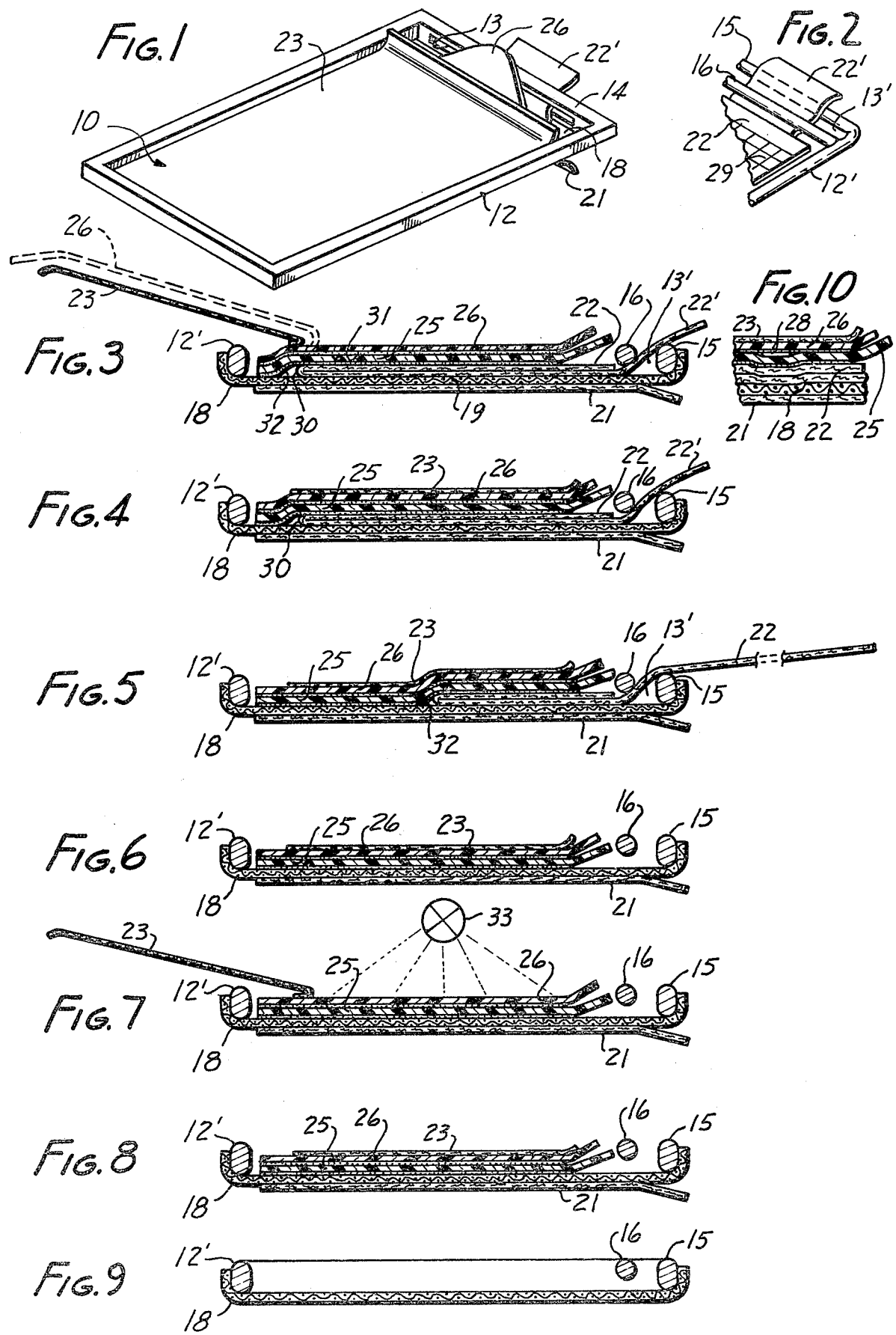

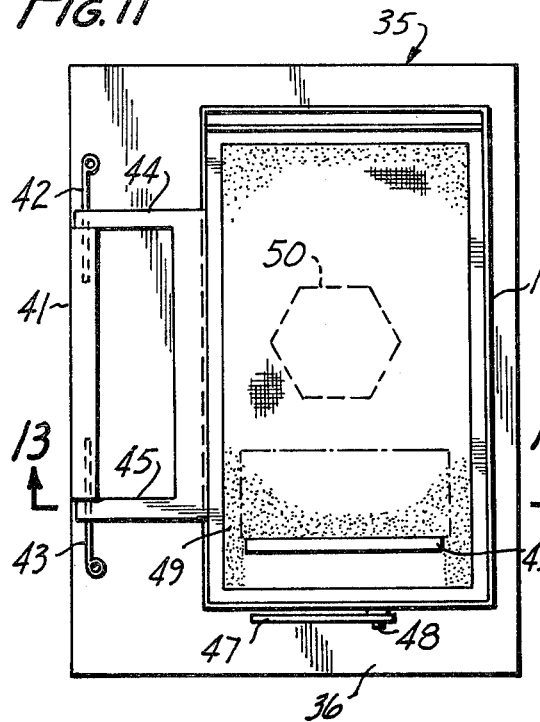
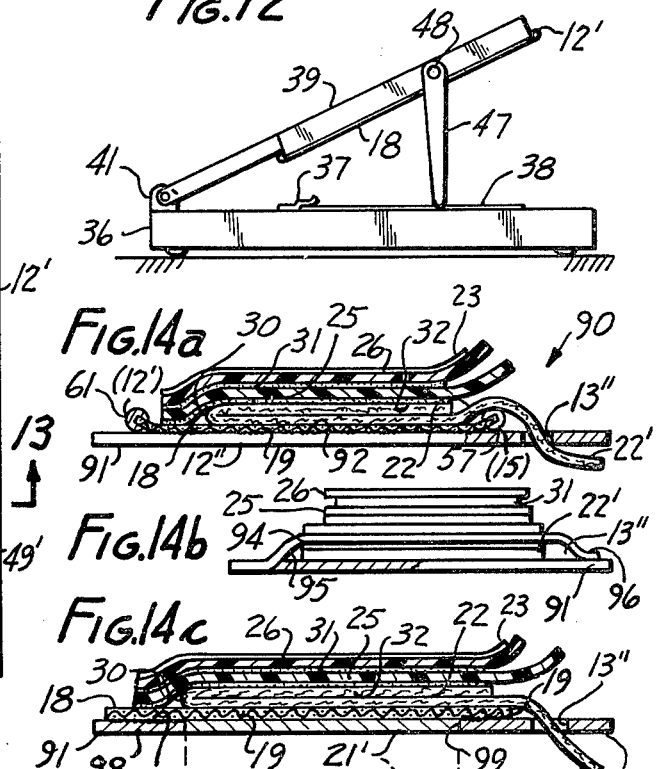
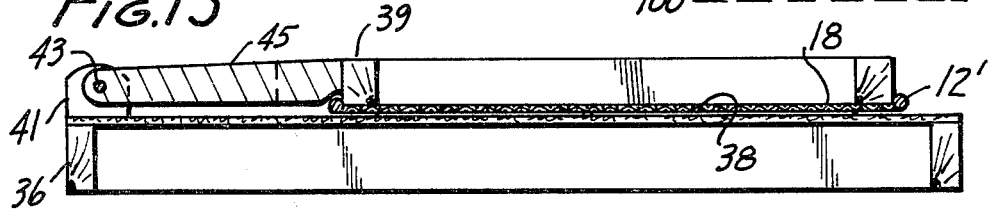
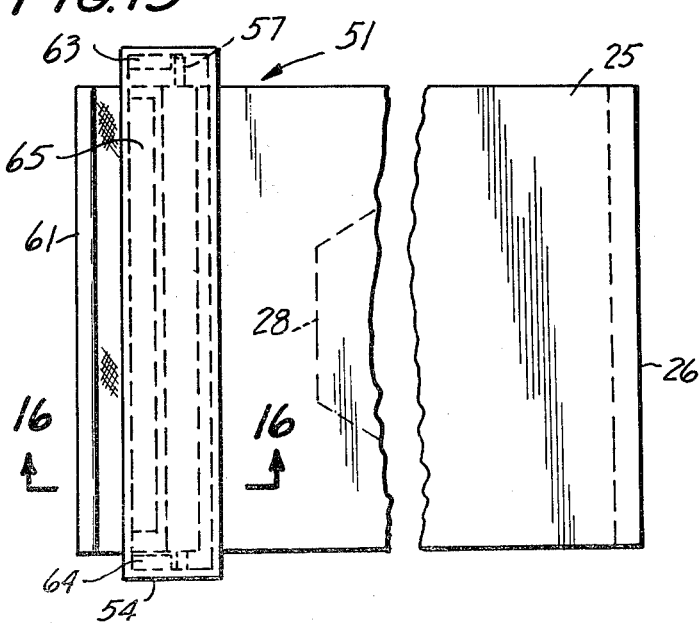
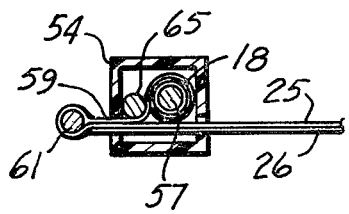

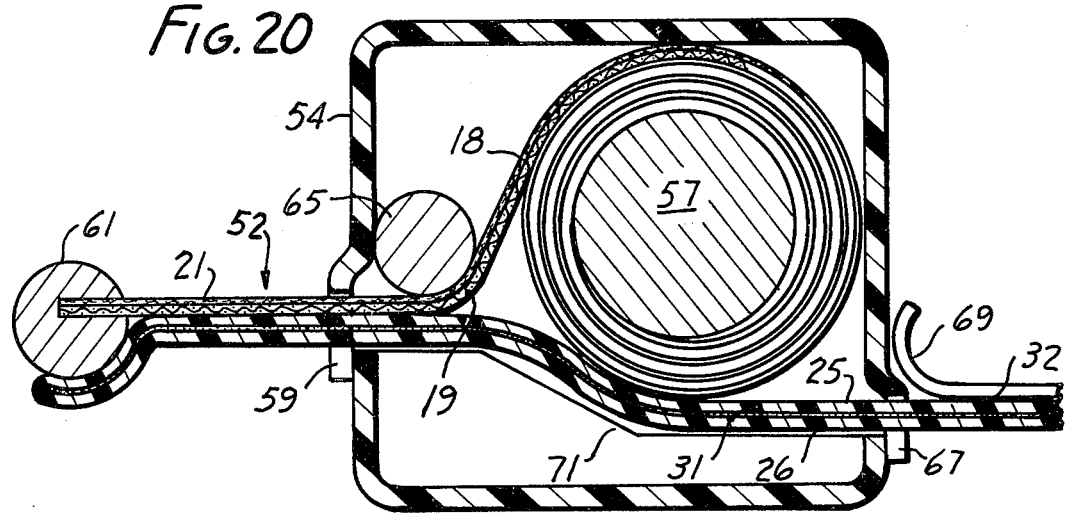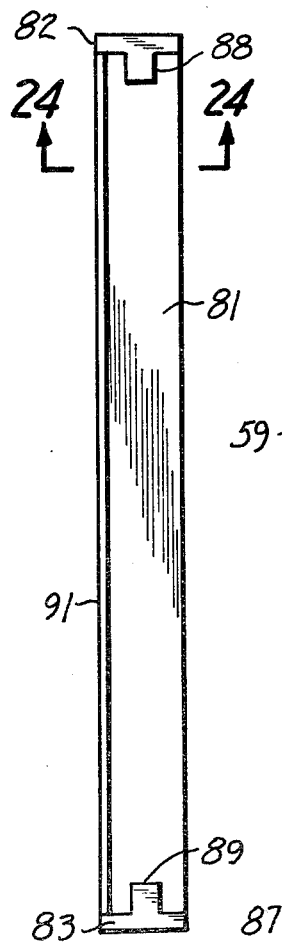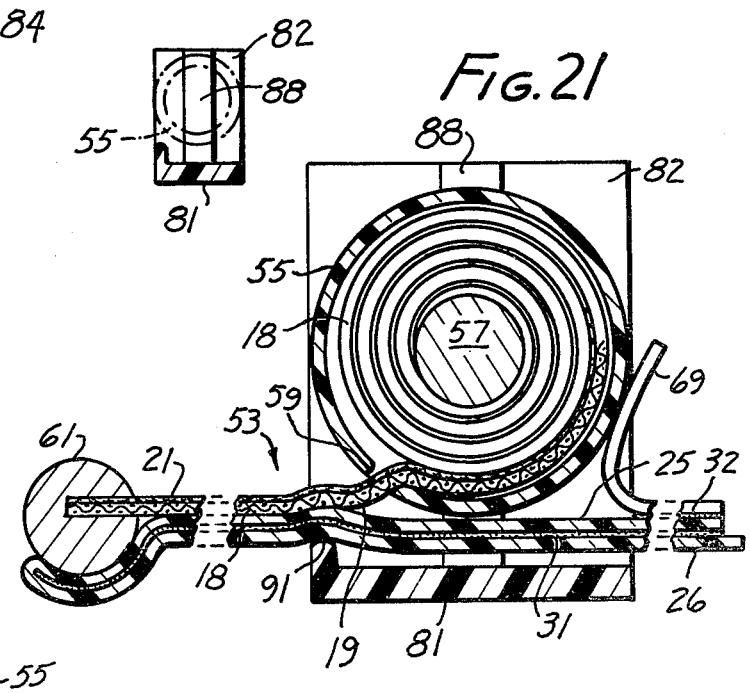

SCREEN PRINTING AND STENCIL ARTICLES, APPARATUS AND METHODS

BACKGROUND OF THE INVENTION

1. Field of the Invention

The subject invention relates to screen printing and stenciling and, more specifically, to screen printing and stencil articles, apparatus and methods.

2. Description of the Prior Art

Silk-screen printing or serigraphy is a well-known ancient art involving a stencil method of printing a design through a piece of silk or other fine cloth on which parts of the design not to be printed have been stopped out by an impermeable film.

Considerable progress has been realized in this art with the availability and use of photosensitive emulsions for selectively stopping areas of the screen upon photographic exposure and development. A further important step in the direction of a more general use of this enjoyable meaningful and useful art came about with the provision and availability of direct photo emulsions, typically of the diazo type, where the photographic development upon exposure is conveniently reduced for the user to a washout under subdued light, whereby the emulsion will be removed from non-stopped areas of the screen.

Despite these recent advances, the state of the art still fails to provide artists and amateurs alike with a convenient tool and technique to make full use of the artistic, entertainment, recreational and commercial potentials of silk screening or serigraphy.

Rather, a typical technique, even with the most advanced materials, is to provide a wooden support filled with foam rubber, to place the screen with photosensitive emulsion on that support and foam rubber pad, to cover the screen with a sheet of transparent glass and with a sheet of an opaque substance to prevent premature exposure. A design may then be provided on the glass plate and the photosensitive emulsion may then be exposed through the design. Upon photographic exposure and development, areas corresponding to the provided design will be selectively stopped and a paint or dye material may be squeezed through the open screen meshes in the non-stopped areas.

It is thus seen that the state of the art is still of a makeshift nature, especially in the area of providing the desired image pattern and preparing the stencil by photographic exposure.

SUMMARY OF THE INVENTION

It is broadly an object of this invention to overcome the above mentioned disadvantages.

It is a germane object of this invention to provide articles, apparatus and methods for more fully realizing the artistic, recreational, educational, entertainment, and commercial potentials of screen printing or serigraphy.

It is also an object of this invention to provide improved silk screen stencils and stencil making methods.

It is a related object of this invention to provide various articles of manufacture and methods resulting in improved screen printing or serigraphy stencils.

It is also an object of this invention to provide improved unitary stencil making assemblies.

As a further general object, this invention aims to make improved screen printing or serigraphy techniques and equipment useful not only to skilled artists, but also to amateurs, general consumers, and children of various ages for their enjoyment, art appreciation and personal development.

Other objects of the invention will become apparent in the further course of this disclosure.

From a first aspect thereof, the subject invention resides in an article of manufacture comprising, in combination, means for providing a stencil including a screen and photosensitive emulsion for selectively stopping areas of the screen upon photographic exposure and development, sheet-like means operatively associated with the screen for receiving an image pattern through which the photosensitive emulsion is to be exposed, means operatively associated with the photosensitive emulsion for shielding the photosensitive emulsion against spurious exposure, and means for combining the stencil providing means, sheet-like image pattern receiving means and shielding means into a unitary stencil making assembly.

From another aspect thereof, the subject invention resides in an article of manufacture comprising, in combination, means for providing a stencil including a screen and photosensitive emulsion for selectively stopping areas of the screen upon photographic exposure and development, sheet-like means operatively associated with the screen for receiving an image pattern through which the photosensitive emulsion is to be exposed, means operatively associated with the photosensitive emulsion for shielding the photosensitive emulsion against spurious exposure, and means for mounting the stencil providing means, sheet-like image pattern receiving means and shielding means in an at least partially coextensive relationship and in a unitary stencil making assembly.

From another aspect thereof, the invention resides in an article of manufacture comprising, in combination, a frame, means for providing a stencil including a screen mounted on the frame and photosensitive emulsion on the screen for selectively stopping area of the screen upon photographic exposure and development, sheet-like means at least partially coextensive with the screen for receiving an image pattern through which the photosensitive emulsion is to be exposed, and means operatively associated with the photosensitive emulsion for shielding the emulsion against spurious exposure, including a sheet-like exposure shield removably disposed between the screen and the sheet-like image pattern receiving means.

From another aspect thereof, the subject invention resides in an article of manufacture comprising, in combination, a housing, means in the housing for providing a stencil including a screen and photosensitive emulsion for selectively stopping areas of the screen upon photographic exposure and development, sheet-like means for receiving an image pattern through which the photosensitive emulsion is to be exposed, means connected to the stencil providing means for removing the stencil providing means from the housing and applying the stencil providing means to the image pattern receiving means.

From yet another aspect thereof, the subject invention resides in an article of manufacture for providing a stencil and, more specifically, resides in the improvement comprising in combination a rectangular screen, photosensitive emulsion on the screen for selectively stopping areas of the screen upon photographic exposure and development, a first elongate screen mounting member attached to and extending along a first side of the screen, and a second elongate screen mounting member attached to and extending along an opposite second side of the screen, with the screen being self-supporting between the first and second mounting members.

From another aspect thereof, the subject invention resides in a stencil comprising, in combination, a rectangular screen having meshes, means on the screen for selectively stopping a first area of the screen, the screen having adjacent the first area a second area comprising open meshes of the screen, a first elongate screen mounting member attached to and extending along a first side of the screen, and a second elongate screen mounting member attached to and extending along an opposite second side of the screen, with the screen being self-supporting between the first and second mounting members.

From still another aspect thereof, the subject invention resides in a method of making a stencil from a screen including photographic emulsion for selectively stopping areas of the screen upon photographic exposure and development. The invention according to this aspect resides, more specifically, in the improvement comprising in combination the steps of providing sheet-like means for receiving an image pattern through which the photosensitive emulsion is to be exposed, shielding the photosensitive emulsion against spurious exposure, combining the sheet-like image pattern receiving means and the screen with shielded photosensitive emulsion into a unitary stencil making assembly, providing the image pattern receiving means with an image pattern while maintaining the photosensitive emulsion shielded against spurious exposure, applying the sheet-like image pattern receiving means with image pattern to the screen, and subjecting the photosensitive emulsion to exposure through the image pattern and to development and removing the image pattern receiving means from the screen to provide a stencil corresponding to the image pattern.

From another aspect thereof, the subject invention resides in a method of making a stencil from a screen including photographic emulsion for selectively stopping areas of the screen upon photographic exposure and development. The invention according to this aspect resides, more specifically, in the improvement comprising in combination the steps of providing sheet like means for receiving an image pattern through which the photosensitive emulsion is to be exposed, shielding the photosensitive emulsion against spurious exposure, mounting the sheet-like image pattern receiving means and screen with photosensitive emulsion in an at least partially coextensive relationship and in a unitary stencil making assembly, providing the image pattern receiving means with an image pattern while maintaining the photosensitive emulsion shielded against spurious exposure, applying the sheet-like image pattern receiving means with image pattern to the screen, and subjecting the photosensitive emulsion to exposure through the image pattern and to development and removing the image pattern receiving means from the screen to provide a stencil corresponding to the image pattern.

From another aspect thereof, the subject invention resides in a method of making a stencil from a screen including photographic emulsion for selectively stopping areas of the screen upon photographic exposure and development. The invention according to this aspect resides, more specifically, in the improvement comprising in combination the steps of providing shielding means against spurious exposure including a housing for the screen with photographic emulsion, storing the screen with photographic emulsion in the housing, providing sheet-like means for receiving an image pattern through which the photosensitive emulsion is to be exposed, combining the sheet-like means and the housing with stored screen and photographic emulsion into a unitary stencil making assembly, providing the image pattern receiving means with an image pattern while maintaining the photosensitive emulsion shielded against spurious exposure, removing the screen with photographic emulsion from the housing and applying the sheet-like image pattern receiving means with image pattern to the screen, and subjecting the photosensitive emulsion to exposure through the image pattern and to development and removing the image pattern receiving means from the screen to provide a stencil corresponding to the image pattern.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or functionally equivalent parts, and in which:

FIG. 1 is a perspective view of a unitary stencil making assembly in accordance with a preferred embodiment of the subject invention;

FIG. 2 is a detail view showing a modification of the assembly of FIG. 1 in accordance with a preferred embodiment of the subject invention;

FIGS. 3 to 9 are longitudinal sections through the type of unitary stencil making assembly shown in FIGS. 1 and 2, illustrating progressive steps, and thus collectively constituting a flow chart of the use of the stencil making assembly;

FIG. 10 is a detail view of part of the stencil making assembly at a certain state of operation thereof;

FIG. 11 is a top view of a screen printing apparatus in accordance with a preferred embodiment of the subject invention;

FIG. 12 is a side view of the apparatus shown in FIG. 11;

FIG. 13 is a section on an enlarged scale, taken along the line 13—13 in FIG. 11;

FIG. 14a is a longitudinal side view, partially in section, of a unitary stencil making assembly in accordance with a further preferred embodiment of the invention;

FIG. 14b is a lateral side view, partially in section of a modification of the unitary stencil making assembly shown in FIG. 14a; and FIG. 14c is a view similar to FIG. 14a showing a further modification in accordance with a preferred embodiment of the invention;

FIG. 15 is a plan view of a further unitary stencil making assembly in accordance with a preferred embodiment of the subject invention;

FIG. 16 is a section taken along the line 16—16 in FIG. 15;

FIG. 20 is a view similar to FIG. 17, showing a unitary stencil making assembly in accordance with another preferred embodiment of the subject invention;

FIG. 21 is a transverse section through a unitary stencil making assemlby in accordance with a further preferred embodiment of the subject invention;

FIGS. 22 and 23 are plan views of different parts of the assembly of FIG. 21; and FIG. 24 is a section taken along the line 24—24 in FIG. 22.

DESCRIPTION OF PREFERRED EMBODIMENTS

Figure 17:
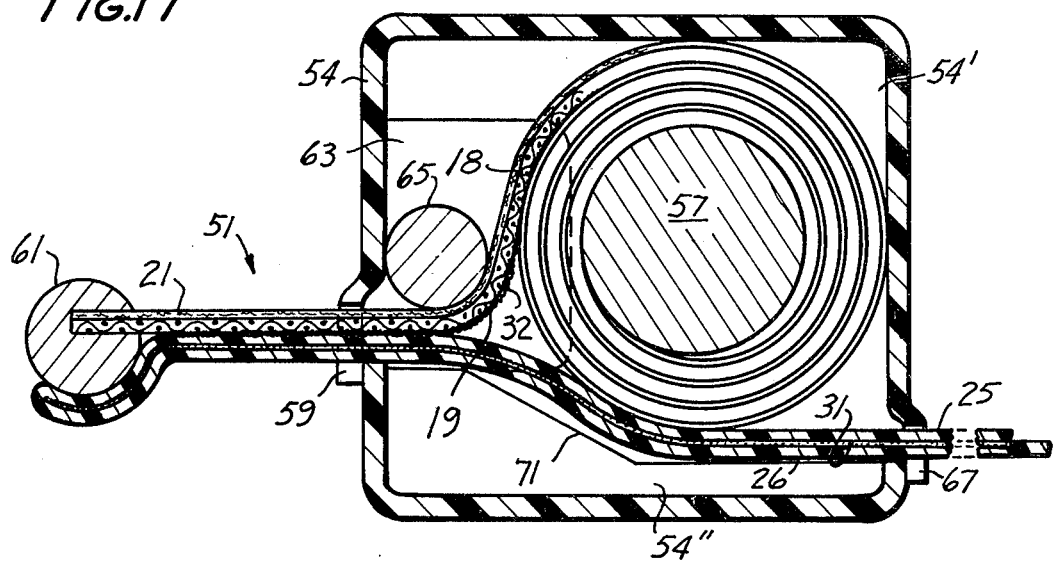
FIG. 17 is a view similar to FIG. 16 on an enlarged scale of a unitary stencil making assembly in accordance with a preferred embodiment of the subject invention.
Figure 18:
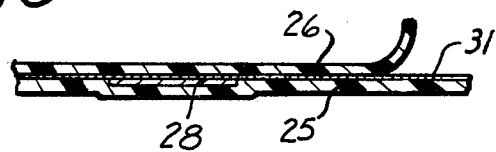
FIG. 18 is a detail view on an enlarged scale of the unitary stencil making assembly of FIGS. 15 to 17.

The article of manufacture or unitary stencil making assembly 10 shown in FIG. 1 has a frame 12 which, for instance, may be of metal or of a plastic material. The frame 12 may, for instance, be stamped or fabricated. As illustrated in FIG. 2 at 12', the frame may, for instance, be made of wire.

Both frames 12 and 12' have an elongate aperture along one side, namely the aperture or slit 13 shown in FIG. 1 as being provided in one lateral frame member 14, and the elongate aperture or space 13' between a lateral member 15 of the frame 12' and an auxiliary frame member 16 being attached to the body of the frame and extending parallel and in spaced relationship to the lateral frame member 15, as shown in FIG. 2.

In FIGS. 3 to 13, provision and use of the frame 12' are shown, but it should be understood that the frame 12 of FIG. 1 may be employed instead.

A silk screen 18 is attached to or mounted on the frame 12 or 12'. Instead of a silk screen, a screen of a polyester fabric or of any other material used or useful in screen printing or serigraphy may be employed. Also, the silk screen need not be directly attached to the frame, as shown in the drawings, but may be mounted on a frame of paper or other material which is less expensive than silk or polyester fabric and which, in turn, is mounted on or reinforced by the frame 12 or 12'.

The screen 18 carries or has disposed therein a photosensitive emulsion 19 for selectively stopping areas of the screen upon photographic exposure and development. Many photosensitive emulsions suitable for screen printing have been developed and are commercially available under different labels. Popular emulsions are the diazo direct photo emulsions which are applied to print screens in a sensitized state by metal coaters, scoop coaters or rigid strips of plastic materials and which, upon selective photographic exposure provides stopped areas through which no paint or dye can be squeezed and complementary unstopped areas comprised of open screen meshes through which paint or dye can be applied to an underlying paper or other printout medium. Since the requisite photosensitive emulsion is readily available from different commercial sources, no specific examples of its composition need be given here.

Nonetheless, it may be noted that the popular screen printing polyvinyl acetate and polyvinyl alcohol emulsions with added diazo sensitizer may be used in the practice of the subject invention and will upon exposure in the screen 18 provide a pattern of water-insoluble and paint or dye impermeable areas, complemented by water-soluble areas which, upon washout of the screen, provide a pattern of open-mesh, paint or dye transmissive areas corresponding to the image or design to which the emulsion has been exposed.

The photographic emulsion is shielded against spurious exposure. For instance, a tacky backing strip 21 is applied to the lower side of the screen 18 as shown in FIGS. 1 and 3 to 8. The strip 21 is of black paper or another opaque material and covers the entire portion of the screen that is intended to be used in the screen printing process. The strip 21 may have a light adhesive coating so as to be easily peelable from the screen 18. If desired, the strip 21 may be replaced by an opaque coating that is preferably washable from the screen upon photographic development or washout thereof.

In addition to the opaque peelable backing strip 21, the means for shielding the photosensitive emulsion 19 against spurious exposure include a sheet-like exposure shield 22 and an opaque cover sheet 23, both to be more fully described below.

Sheet-like means are operatively associated and, in the embodiments of FIGS. 1 to 8, are at least partially coextensive with the screen 18 for receiving an image pattern through which the photosensitive emulsion is to be exposed. For instance, it is within the broad contemplation that these image pattern receiving means comprise one transparent sheet 25 to which the desired image pattern or design may be applied. However, in the illustrated preferred embodiments, the sheet-like image pattern receiving means include a pair of sheet-like members or transparent sheets 25 and 26 for receiving image pattern defining means or designs therebetween.

In practice, a large variety of commercially available synthetic or plastic flexible transparent sheets is suitable as the sheets 25 and 26.

A design or image pattern may be applied to the top sheet 26 or the top sheet 26 may be removed from the lower sheet 25 as indicated by dotted lines in FIG. 3 and the design or image pattern may be applied to the lower sheet 25. For instance, India ink or another opaque liquid or medium may be employed to draft or paint a design pattern on either or both of the sheets 25 and 26. Transfer lettering may also be employed for this purpose. Alternatively, thin opaque designs, lettering or other objects 28 may be placed as image patterns on the lower sheet 25 or between the sheets 25 and 26 as shown in FIG. 10.

A cross-line pattern 29 may, for instance, be printed or otherwise provided on the exposure shield 22 so as to appear below the sheet 25 and facilitate the application of various designs and other image patterns thereto.

Generally, the exposure shield 22 may be white on the outside to provide a suitable background for the application of designs to the sheets 25 and/or 26 and black or otherwise opaque on the inside to shield the emulsion 19 against exposure.

The partially removed top sheet 26 is again placed onto the lower sheet 25 after application of the desired image pattern to these pattern receiving means. Application of the top sheet 26 to the lower sheet 25 and retention of the image pattern therebetween are facilitated by the provision of an adhesive layer 31 on one of the sheets, preferably on the side of the top sheet 26 facing the lower sheet 25.

In accordance with an important feature of the illustrated preferred embodiment presently under consideration, the lower side of the sheet 25 facing the screen 18 is also provided with an adhesive layer 32. Various adhesive sprays are known which will provide a sheet with a tacky coating. Also, the widely distributed and used familiar types of adhesive transparent tape have adhesive coatings which will adhere to objects and subsequently be readily peelable therefrom.

As indicated in FIGS. 3 to 8, the image pattern receiving means composed of the mutually adhesive, manually separated pair of sheets 25 and 26 is attached to the screen 18 along an edge thereof. Of course, the sheets 25 and 26 could directly be attached to the frame 12 or 12', the objective in each case being to combine the screen or stencil providing means 18 and the sheet-like image pattern receiving means 25 and 26, as well as the shielding means 21, 22 and 23 into a unitary stencil making assembly. For the same reason, the opaque cover sheet 23 is attached either to the sheet 26 as shown in FIGS. 3 to 8, or alternatively to the screen 18 or directly to the frame 12 or 12'; the objective being to mount the stencil providing means or screen 18, the sheet-like image pattern receiving means or sheets 25 and 26 and the shielding means 21, 22 and 23 in an at least partially coextensive relationship in the unitary stencil making assembly.

In particular, the sheet-like exposure shiled 22 is removably disposed between the screen 18 and the image pattern receiving sheets 25 and 26 and is of opaque paper or another opaque material to shield the photosensitive emulsion 19 against premature exposure while the image pattern is applied to the sheet 25 or inbetween the sheets 25 and 26 as illustrated in FIGS. 3 and 10.

As seen in FIGS. 3 and 4, the sheet-like exposure shield 22 extends inbetween the screen 18 and the image pattern receiving sheet 25 in a first direction from an edge portion adjacent the elongate aperture 13 or 13' at one side of the frame along the adhesive layer 32 on the sheet 25 to a region adjacent the other side of the frame at 30 and thence in an opposite second direction along the screen 18 back to the vicinity of the opening 13 or 13', and thence through that elongate aperture 13 or 13' to form a manually engageable tab 22' for a removal or disposal of the shield 22' through the frame opening 13 or 13'. In cases where the adhesive layer 32 is provided on the screen, rather than on the sheet 25, the shield 22 would extend from the mentioned edge portion adjacent the elongate aperture 13 or 13' in a first direction along the adhesive layer 32 on the screen 18 to the region at 30 and thence in an opposite second direction along the sheet 25 back to and out through the aperture 13 or 13' for manual removal. In either case, the specified arrangement of the shield 22 assures an easy removal thereof, despite the presence of the adhesive layer 32.

In particular, the opaque cover sheet 23 is returned onto the screen pack assembly as shown in FIG. 4 after the desired image pattern has been provided on the sheet 25 or between the sheets 25 and 26, in order to shield the photosensitive emulsion against spurious exposure during removal of the shield 22. The tab 22' may then be manually engaged and the exposure shield 22 may be pulled out of the screen pack assembly through the elongate frame aperture 13 or 13', as shown in FIG. 5.

During removal of the exposure shield 22, the image pattern receiving assembly including the sheet 22 is pressed downwardly against the screen 18 and will become releasably attached to the screen by the adhesive coating 23. It should be noted in this connection that means other than an adhesive coating, such as, for instance, electrostatic attraction, may be utilized for causing the sheet 25 to adhere to the screen 18 and/or to the sheet 26.

It will thus be noted that the sheet 22 is not only an exposure shield, but also an effective means for initially maintaining at least a major portion of the image pattern receiving sheets 25 and 26 separate from the screen 18 and for thereafter applying the sheet 25 or, in other words, the assembly of sheets 25 and 26 to the screen preparatory to photographic exposure of the photosensitive emulsion.

After the screen pack assembly has thus been brought to an exposure ready condition as shown in FIG. 6, the cover sheet 23 is again removed as shown in FIG. 7. The photosensitive emulsion 19 in the screen 18 is thereby exposed to a light source 33 via the image pattern (see 28, FIG. 10) between the transparent sheets 25 and 26. The light source 33 may, for instance, be the sun or then an artificial actinic light source.

Upon completed photographic exposure, the cover sheet 23 may again be flipped shut as shown in FIG. 8 to prevent overexposure pending development of the photographic emulsion. Shortly prior to development, the opaque cover sheet 23 and sheets 25 and 26 may be removed from the screen pack as an assembly. The opaque coating or cover strip 21 may also be removed from the bottom of the screen 18 at that time or, if desired, in the actual course of photographic development.

The nature of the photographic development of the emulsion 19 depends on the nature of that emulsion. Some conventional photographic materials require the application of chemical developers. However, I presently prefer for the practice of my invention one of the newer direct photo emulsions which develop into stopped or blocked areas and dye or paint transmitting areas upon exposure and washout. The expression "development" as herein employed is intended to be broad enough to cover such modern emulsions and their highly simplified photographic processing.

As shown in FIG. 9, the photographic pack is now in a condition denuded of all covers, sheets and shields, leaving only the exposed and developed screen 18 on the frame 12 or 12', with the selectively stopped or impermeable areas and the complementary transmissive or open mesh areas or portions.

Paint, dye dyestuff or another image forming agent may now be passed through the transmissive portion of the stencil developed in the screen 18, in order to provide an image corresponding to the image pattern 28 etc. to which the photographic emulsion has been exposed in the photosensitive state. This resulting image may be provided on or received by sheets of paper or other printout material in a conventional manner.

In practice, it is a feature of a preferred embodiment of the subject invention that the frame 12 or 12' need not be rigid or strong enough to be fully self-supporting during printout of the image pattern. Rather, the frame 12 or 12' may, in turn, be retained by a stronger structure during printout of the image.

In this respect, FIGS. 11 to 13 show a screen printing apparatus in accordance with a preferred embodiment of the subject invention.

This screen printing apparatus 35 has a base 36. One or more clips 37 are attached to the base 36 for a releasable retention of paper sheets or other printout media 38 on the base 36. A supporting frame 39 is movable relative to the base 36. In particular, the base has a block 41 carrying pivot pins 42 and 43. Arms 44 and 45 project laterally from the frame structure 39 and have the pivot pins 42 and 43, respectively, extend through portions thereof, for pivotally moving the supporting frame 39 relative to the base 36 and inserted sheets 38.

The frame 12 or 12' of the developed photographic screen pack is releasably attached to the supporting frame structure 39. The frame 12 or 12' is preferably made of resilient wire, a resilient plastic or another resilient material and may be slightly smaller in its inside two-dimensional extent than the supporting frame structure 39, so that the frame 12 or 12' will readily clamp on the frame structure 39 as shown in FIGS. 12 and 13.

A support member 47 may be pivotally attached to the frame structure 39 at 48 in order to retain the screen 18 in a raised position as shown in FIG. 12 during insertion and removal of paper sheets 38.

The support member 47 may then be swung about the pivot 48 and the support structure 39 and frame 12 or 12' lowered until the screen 18 contacts a sheet 38 as shown in FIG. 13. Transmissive designs 50 in the screen 18 may then be printed out, such as by means of paint 49 which is applied through the open mesh or to the transmissive portions of the screen by means of a squeegee 49' or other applicator, whereby paint will be squeezed through open meshes of the screen onto a sheet 38, but will be stopped or blocked by the pattern of the developed photographic emulsion provided in the screen 18 in the manner shown in FIGS. 3 to 10.

Of course, the screen 18 and frame 12 and 12' could also be used as shown in FIG. 9 without employment of a supporting frame structure 39.

The unitary stencil making assemblies 51, 52 and 53 of FIGS. 15 to 18 and 20 to 24 are characterized by a housing 54, 55 for storing at least a major portion of the screen 18 with photosensitive emulsion 19. The housing 54 or 55 may shield the photosensitive emulsion 19 against spurious exposure, and may be opaque for that purpose. By way of example, the housing 54 or 55 may be made of such materials as metal, plastic or synthetic resin, and cardboard.

Figure 19:
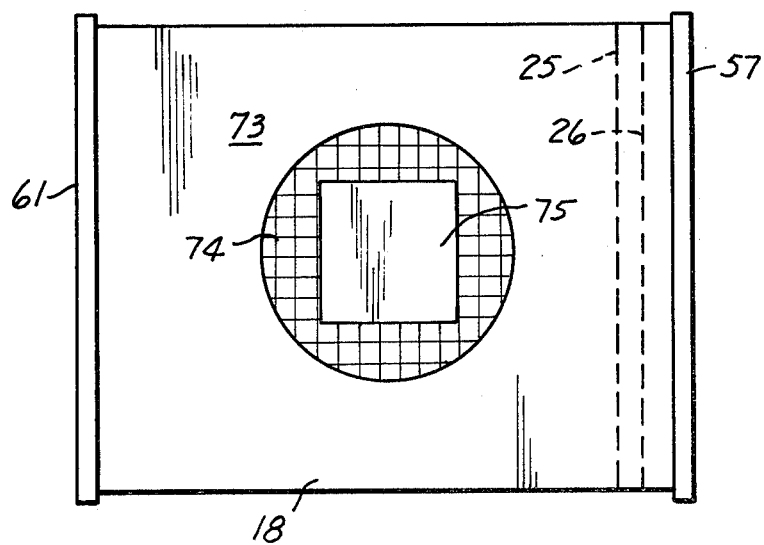
FIG. 19 is a plan view of a stencil according to a preferred embodiment of the subject invention.

In the illustrated preferred embodiments shown in FIGS. 15 to 18 and 20 to 24, the screen 18 with photosensitive emulsion 19 is wound in the housing. In particular, the screen 18 is wound on a shaft 57. As seen in FIG. 19, the shaft 57 also operates as a first elongate screen mounting member attached to and extending along a first side of the screen 18. Each housing has a longitudinal slot 59 through which part of the otherwise wound screen extends to the outside of the housing. A shaft or rod 61 is attached to the screen 18 outside of the housing and constitutes a handle for unwinding the wound screen 18 from the housing through the slot 59 preparatory to an exposure of the photosensitive emulsion 19.

In particular, and as seen in FIG. 19, the shaft or handle 61 acts as a second elongate screen mounting member attached to and extending along an opposite second side of the screen 18.

As before, the unitary stencil making assembly includes image pattern receiving means which preferably comprise the above mentioned transparent flexible sheets 25 and 26 which are releasably attached to each other, such as by an adhesive coating or layer 31. As shown in FIGS. 17, 20 and 21, the sheets 25 and 26 may in effect be part of one and the same flexible transparent sheet folded over upon itself. An end portion of the image pattern receiving sheets 25 and 26 is attached to the shaft or handle 61 for an application of the assembled image receiving sheets 25 and 26 to the screen 18 upon unwinding of that screen from the housing.

As before, the pair of sheets 25 and 26 is mutually adhesive and manually separable for receiving image pattern defining means 28 etc. therebetween. To this end, the sheets 25 and 26 are pulled apart prior to the unwinding of the screen 18 from the elongate housing, and opaque designs or image defining objects are drawn or placed on either sheet. The sheets 25 and 26 are then again superimposed on each other and the handle 61 is pulled away from the housing 54 or 55 whereby the screen 18 with photosensitive emulsion 19 will be unwound from the housing through the slot 59 and will thereby be applied to and placed into coextensive relationship with the loaded pattern receiving sheets 25 and 26.

As seen in FIGS. 15 and 17, unwinding of the screen from the housing may be facilitated by the provision of blocks or stops 63 and 64 which provide bearing surfaces for end portions of the shaft 57 during unwinding of the screen. As further shown in FIGS. 15 to 17, a roller 65 may be provided in the housing 54 adjacent the elongate exit slot 59 for facilitating removal of the wound screen from the housing and application to the sheet 25. The roller 65 may be free floating.

In the embodiment shown in FIGS. 15 to 18 and 20, the sheets 25 and 26 with provided image pattern 28 etc. are pulled through the housing 54 for an application of the image pattern sheets 25 and 26 with image pattern to the unwinding screen 18. To this end, the housing 54 has a second elongate slot 67 which extends parallel to the first slot 59, with the slot 59 and 67 being located in opposite sides of the elongate housing. As mentioned above, the housing 54 or 55 is preferably opaque to shield the photosensitive emulsion 19 against spurious exposure during storage of the stencil making assembly and during loading of the sheets 25 and 26 with image defining designs or patterns while major portions of the transparent sheets 25 and 26 are still located outside the housing.

Alternatively or additionally, the screen 18 may be provided with an opaque coating or backing 21. Such a backing 21 is useful even if the housing itself is opaque, since it will continue to shield the photosensitive emulsion 19 against spurious exposure even after the screen 18 has been pulled or unrolled from the housing 54 or 55. As before, the backing 21 may be removed shortly prior to or during photographic development or washout.

For best results and registry, the sheet 25 should again be caused to adhere to the screen 18, such as electrostatically or adhesively. For instance, a surface of the screen 18 may be provided with an adhesive coating 32 for adherence of screen 18 to the sheet 25 upon removal of the wound screen from the housing. The adhesive 32 may be of a washable type if development by washout is contemplated.

Alternatively and as shown in FIGS. 20 and 21, the adhesive coating or layer 32 may again be provided on the transparent sheet 25 of the image pattern receiving assembly. In that case, it is preferable to provide the adhesive coating 32 with a peelable backing strip 69 which is manually removed prior to the pulling of the loaded and assembled sheets 25 and 26 through the housing 54 or past the housing 55.

In the embodiments of FIGS. 15 to 18 and 20, the housing 54 includes two parts 54' and 54" which are separable along the first and second slots 59 and 67 and across the end walls as indicated by lines 71 in FIGS. 17 and 20.

After the screen 18 has been unwound in the housing, the housing parts 54' and 54" may be taken apart and the housing may thus be removed from the unwound screen and attached shaft 57. The screen 18 and the applied image pattern bearing sheets indicated only by dotted lines 25 and 26 in the top view of FIG. 19, are then self-supporting between the shafts or screen mounting members 57 and 61. Exposure of the photosensitive emulsion 19 through the applied image pattern may then take place generally in the manner shown in and described above in connection with FIG. 7. Upon exposure, the sheets 25 and 26 with applied image pattern may be removed and the exposed emulsion photographically developed to provide the desired pattern of stopped areas and complementary unstopped or open mesh areas in the screen 18. Upon removal of the backing coating or strip 21, the screen 18 with its provided stencil is ready for printout, such as with a suitable dye or paint and a suitable instrument, such as a squeegee and apparatus (see FIGS. 13 and 14).

The self-supporting screen 18 with lateral screen mounting members 57 and 61 has implications beyond the mere product of the photographic stencil making processes herein disclosed. In particular, the self-supporting rectangular screen 18 provides an ideal stencil which is free of a familiar drawback of most conventional stencils.

More specifically, in a conventional type of stencil in which the paint transmissive portions are removed by stamping or are otherwise cut out, it is always necessary to leave connecting material strips or members for retaining non-transmissive portions within transmissive portions of the stencil. For instance, a metal sheet stencil of the letter O will require a circular or oval stencil portion within a wider circular or oval opening. This central stencil portion, in turn, has to be retained by one or typically two strips which attach it to and maintain it spaced from the remainder of the stencil.

As illustrated in FIG. 19, this can be avoided in accordance with a preferred embodiment of the subject invention. In particular, the screen 18 may be provided with means for selectively stopping a first area 73 of the screen against a transmission of paint. The screen 18 may then have adjacent the first area 73 a second area 74 comprising open meshes of the screen through which paint can be applied to an underlying paper or other printout medium.

The screen 18 may further be provided with means for stopping a third area 75 of the screen against transmission of paint.

In accordance with the preferred embodiment shown in FIG. 19, the stopped third area 75 is completely spaced from the stopped first area 73, and the second area 74 comprises open screen meshes in an endless array; that is, in an array completely encompassing or surrounding the central stopped third area 75 without interruption by any connecting members between the stopped areas 73 and 75.

Considering FIG. 19, it will be appreciated that the type of stencil shown therein enables provision of prints of lettering and other designs which are free of the often unsightly blank strips or spaces which characterize prints or lettering made with conventional stamped stencils. The stopped areas 73 and 75 and open mesh area 74 may be provided by use of one of the unitary stencil making assemblies herein shown. However, other photographic or non-photographic stencil making techniques may be employed. For instance, the substance which stops the completely spaced areas 73 and 75 may be printed on or otherwise applied to the screen 18. For instance, many synthetic or resinous materials are known which are available in liquid form and become solid when applied in a thin coating and dried or cured.

Even paints will dry and form stopped areas when selectively applied to the screen 18.

The housing 55 used in the preferred embodiment of FIGS. 21 to 24 is similar to the housing 54 in that it is also of an elongate configuration and has a longitudinal slot 59. However, the housing 55 is not typically composed of two separable housing portions. Rather, the housing 55 is tubular and has opposite open ends with which the slot 59 communicates.

A mounting member 81 extends at a spacing from the elongate housing 55 and in parallel to the longitudinal slot 59. The assembled image retaining sheets 25 and 26 extend through the spacing between the housing 55 and mounting member 81 for application to the screen 18 upon unwinding of the screen from the housing.

The mounting member 81 has upright opposite end portions 82 and 83 for closing the open ends 84 and 85 of the tubular housing 55 when the housing has been inserted between the mounting member end portions 82 and 83.

The tubular housing 55 has corresponding notches or keyways 86 and 87 in its opposite end portion, for receiving corresponding projections or keys 88 and 89 in the mounting members 82 and 83.

In this manner, the tubular member 55 is releasably retained against rotation between the upright members 82 and 83 of the mounting strip 81.

The mounting member 81 may be provided with a protruding edge 91 extending parallel to the elongated slot 59 and facilitating application of the screen 18 and sheet assembly 25 and 26 to each other during pulling of the handle 61.

After the screen 18 has been unwound from the housing 55 and applied to the image pattern bearing sheets 25 and 26, the housing 55 and mounting structure 81 to 83 may be separated from each other and the shaft 57 with the portion of the screen 18 then remaining in the housing may be removed from that housing 55 through either open end 84 and 85 thereof.

The unitary stencil making assembly shown in FIG. 14a in accordance with a preferred embodiment of the invention has a cardboard, plastic sheet, sheet metal or other sheet-like support 91 for the stencil providing means, including the screen 18, and other components already discussed above and labeled by corresponding reference numerals. An adehsive layer 92 or other means releasably connect the screen 18, bearing the photosensitive emulsion 19, to the support sheet 91. As before, the screen 18 may be provided with two lateral support members or rods 57 and 61. Alternatively, a frame of the type of frame 12 or 12' may be provided for mounting the screen 18. The elongate aperture 13 or 13' may be omitted on the frame structure 12 or 12' and is preferably provided as an aperture 13" in the support sheet 91 for a convenient manual engagement of the tab 22' and removal of the exposure shield 22 through the opening 13".

According to the modification of FIG. 14b, the aperture 13" is provided by a relatively narrow strip 94 which is either punched or formed out of the support sheet 91 as shown at 95 or is applied and fastened to the support sheet 91 as shown at 96 in FIG. 14b. Except for the strip 94 and the location of the tab 22' on the top of the support sheet 91, the longitudinal side view of the embodiment of FIG. 14b is or may be the same as that of the embodiment shown in FIG. 14a.

According to the preferred embodiment shown in FIG. 14c, the sheet-like support has a flat frame section 98 which may be rectangular, defining a central opening 99. The screen 18 with photosensitive emulsion 19 extends across the opening 99 and is attached to or mounted on the frame section 98 by an adhesive 100 or other fastening means.

Initially, the frame opening 99 is covered by an opaque central cover 21' which corresponds to the above mentioned backing strip 21 in preventing premature exposure of the photosensitive emulsion.

The central cover 21' is manually removable from the frame section 98 as indicated by dotted lines in FIG. 14c. For this purpose, the cover 21' may releasably be attached to the frame section 98. In particular, the frame section 98 and central cover 21' may be punched or otherwise formed from a single sheet, providing the support 91. The cover 21' may be provided in the frame section in a break-away fashion by weakened or frangible connecting portions so as to be easily removable from the screen 18 and frame section 98 after exposure or during or after development or washout of the photosensitive emulsion.

The elongate aperture 13" for removal of the exposure shield 22 may again be provided in the support sheet 91 and particularly in the frame section 98. A strip or strap 94 may be applied to the frame section 98 to provide the elongate opening on top of the support sheet 91, generally as shown in FIG. 14b.

In FIGS. 14a to c, the unitary stencil making assembly again may be provided with transparent sheets 25 and 26 having adhesive layers 31 and 32 and being attached to the screen 18 or then directly to the support sheet 91 or frame section 98 for receiving image patterns.

The operation of the preferred embodiments of FIGS. 14a to c essentially may be the same as the operation of the embodiments of FIGS. 1 to 9 described above. With particular reference to FIG. 9 or then to FIG. 19, the result again is a screen with a frame, this time preferably formed by the frame section 98, or with lateral support members 57 and 61, and with complementary open-mesh or paint transmissive and closed-mesh or stopped areas, by means of which images can be printed through, as in a conventional type of silk screen.

It will thus be recognized that the subject invention and its various aspects and embodiments meet all the above mentioned objects.

Also, the subject extensive disclosure will suggest or render apparent to those skilled in the art various modifications and variations within the spirit and scope of the subject invention.

I claim:

1. An article of manufacture comprising in combination:

means for providing a stencil including a screen and photosensitive emulsion for selectively stopping areas of said screen upon photographic exposure and development;

sheet-like means for receiving an image pattern through which said photosensitive emulsion is to be exposed;

means for shielding said photosensitive emulsion against spurious exposure, said shielding means including an exposure shield removably disposed between said screen and said image pattern receiving means; and means for combining said stencil providing means, sheet-like image pattern receiving means and shielding means into a unitary stencil making assembly.

2. An article as claimed in claim 1, wherein:
said combining means include means for interconnecting said screen and said sheet-like image pattern receiving means.

3. An article as claimed in claim 1, wherein:
said image pattern receiving means include a pair of sheet-like members for receiving image pattern defining means.

4. An article as claimed in claim 1, wherein:
said image pattern receiving means include a pair of mutually adhesive, manually separable members for receiving image pattern defining means.

5. An article as claimed in claim 1, including:
means partially located between said stencil providing means and said image pattern receiving means for initially maintaining at least a major portion of said image pattern receiving means separate from said screen and for permitting said image pattern receiving means to contact said screen preparatory to photographic exposure of said photosensitive emulsion.

6. An article as claimed in claim 1, including:
means partially located between said stencil providing means and said image pattern receiving means for initially maintaining at least a major portion of said image pattern receiving means separate from said screen and for permitting said image pattern receiving means to contact said screen preparatory to photographic exposure of said photosensitive emulsion; and means located on at least one of said screen and said image pattern receiving means for causing said applied image pattern receiving means to adhere to said screen.

7. An article as claimed in claim 1, wherein:
said image pattern receiving means include a transparent sheet.

8. An article as claimed in claim 1, wherein:
said image pattern receiving means include a pair of mutually adhesive, manually separate transparent sheets for receiving image pattern defining means.

9. An article as claimed in claim 1, wherein:
said image pattern receiving means include transparent means; and
said exposure shield is removably disposed between said screen and said transparent means and bears a cross-line pattern visible through said transparent means for facilitating application of an image pattern to said transparent means.

10. An article of manufacture comprising in combination:
a frame;
means for providing a stencil including a screen mounted on said frame and photosensitive emulsion on said screen for selectively stopping areas of said screen upon photographic exposure and development;

sheet-like means at last partially coextensive with said screen for receiving an image pattern through which said photosensitive emulsion is to be exposed; and means for shielding said emulsion against spurious exposure, including a sheet-like exposure shield removably disposed between said screen and said sheet-like image pattern receiving means.

11. An article as claimed in claim 10, wherein:
said shielding means further include an opaque removable coating on a side of said screen remote from said image pattern receiving means.

12. An article as claimed in claim 10, wherein:
said shielding means further include an opaque removable sheet on a side of said screen remote from said image pattern receiving means.

13. An article as claimed in claim 10, wherein:
said shielding means further include an opaque removable sheet on said image pattern receiving means.

14. An article as claimed in claim 10, wherein:
said sheet-like exposure shield extends between said screen and said image pattern receiving means in a first direction along said sheet-like image pattern receiving means and in an opposite second direction along said screen.

15. An article as claimed in claim 10, including:
an adhesive coating on at least one of said screen and image pattern receiving means for causing said image pattern receiving means to adhere to said screen upon removal of said exposure shield.

16. An article as claimed in claim 10, including:
means for causing said image pattern receiving means to adhere to said screen upon removal of said exposure shield.

17. An article as claimed in claim 10, wherein:
said image pattern receiving means include a pair of sheet-like members for receiving image pattern defining means.

18. An article as claimed in claim 10, wherein:
said image pattern receiving means include a pair of mutually adhesive, manually separable members for receiving image pattern defining means.

19. An article of manufacture comprising in combination:
a housing having a slot;
means for providing a stencil including a screen and photosensitive emulsion for selectively stopping areas of said screen upon photographic exposure and development, said stencil providing means being stored in said housing and having a portion extending through said slot for manual removal of said stencil providing means through said slot;
sheet-like means for receiving an image pattern through which said photosensitive emulsion is to be exposed, said image pattern receiving means extending through said slot for joint removal with said stencil providing means; and
means connected to said stencil providing means for removing said stencil providing means from said housing and applying said stencil providing means to said image pattern receiving means.

20. An article as claimed in claim 19, wherein:
said stencil providing means are wound in said housing.

21. An article of manufacture comprising in combination:
a housing having first and second slots;
means in said housing for providing a stencil including a screen and photosensitive emulsion for selectively stopping areas of said screen upon photographic exposure and development;
sheet-like means for receiving an image pattern through which said photosensitive emulsion is to be exposed, said image pattern receiving means extending through said housing via said first and second slots; and
means connected to said stencil providing means for removing said stencil providing means from said housing and applying said stencil providing means to said image pattern receiving means;
said stencil providing means being stored in said housing and having a portion extending through said first slot for joint manual removal of said stencil providing means and image pattern receiving means from said housing.

22. An article as claimed in claim 21, wherein:
said housing includes two parts separable along said first and second slots.

23. An article as claimed in claim 21, including:
a shaft in said housing, said stencil providing means being wound on said shaft.

24. An article as claimed in claim 23, including:
a roller in said housing for facilitating removal of said wound stencil providing means from said housing.

25. An article as claimed in claim 21, including:
means on at least one of said stencil providing means and image pattern receiving means for causing said applied stencil providing means to adhere to said image pattern receiving means.

26. An article as claimed in claim 21, including:
an adhesive on said stencil providing means for releasably attaching said applied stencil providing means to said image pattern receiving means.

27. An article as claimed in claim 21, including:
an adhesive on said image pattern receiving means for releasably attaching said image pattern receiving means to said applied stencil providing means; and
a pealable protective strip on said adhesive.

28. An article as claimed in claim 21, wherein:
said image pattern receiving means include a pair of sheet-like members for receiving image pattern defining means therebetween.

29. An article as claimed in claim 21, wherein:
said image pattern receiving means include a pair of mutually adhesive, manually separable members for receiving image pattern defining means therebetween.

30. An article as claimed in claim 21, wherein:
said image pattern receiving means include a pair of mutually adhesive, manually separate transparent sheets for receiving image pattern defining means therebetween.

31. An article of manufacture comprising in combination:
means for providing a stencil including a screen and photosensitive emulsion for selectively stopping areas of said screen upon photographic exposure and development;
sheet-like means at least partially coextensive with said screen for receiving an image pattern through which said photosensitive emulsion is to be exposed;

means at least partially coextensive with said photosensitive emulsion for shielding said photosensitive emulsion against spurious exposure; and means for mounting said stencil providing means, sheet-like image pattern receiving means and shielding means in a unitary stencil making assembly, said mounting means including a frame connected to at least one of said stencil providing means, sheet-like image pattern receiving means and shielding means, said frame having an elongate aperture, and said shielding means including a sheet-like exposure shield disposable through said elongate aperture.

32. An article of manufacture comprising in combination:

means for providing a stencil including a screen and photosensitive emulsion for selectively stopping areas of said screen upon photographic exposure and development;

sheet-like means at least partially coextensive with said screen for receiving an image pattern through which said photosensitive emulsion is to be exposed;

means at least partially coextensive with said photosensitive emulsion for shielding said photosensitive emulsion against spurious exposure; and means for mounting said stencil providing means, sheet-like image pattern receiving means and shielding means in a unitary stencil making assembly, said mounting means including sheet-like support for said stencil providing means, said sheet-like support having an elongate aperture, and said shielding means including a sheet-like exposure shield disposable through said elongate aperture.

33. An article as claimed in claim 32, wherein:
said sheet-like support has a frame section for mounting said screen, and a central section removable from said frame section for initially covering and, upon removal, uncovering said screen.

34. An article of manufacture comprising in combination:

means for providing a stencil including a screen and photosensitive emulsion for selectively stopping areas of said screen upon photographic exposure and development;

sheet-like means at least partially coextensive with said screen for receiving an image pattern through which said photosensitive emulsion is to be exposed;

means at least partially coextensive with said photosensitive emulsion for shielding said photosensitive emulsion against spurious exposure; and means for mounting said stencil providing means, sheet-like image pattern receiving means and shielding means in a unitary stencil making assembly, said mounting means including a sheet-like support for said stencil providing means, said sheet-like support having a frame section for mounting said screen, and a central section removable from said frame section for initially covering and, upon removal, uncovering said screen.

35. An article as claimed in claim 31, wherein:
said shielding means include a sheet-like exposure shield extending between said screen and said image pattern receiving means in a first direction along said sheet-like image pattern receiving means and in an opposite second direction along said screen.

36. An article as claimed in claim 34, wherein:
said article has an elongate aperture at said sheet-like support; and
said shielding means include a sheet-like exposure shield extending between said screen and said image pattern receiving means in a first direction and thence in an opposite second direction and thence through said elongate aperture for removal through said elongate aperture of the frame.

37. An article as claimed in claim 34, including:
an adhesive coating on at least one of said screen and image pattern receiving means for causing said image pattern receiving means to adhere to said screen upon removal of said exposure shield;
said article having an elongate aperture at said sheet-like support; and
said shielding means including a sheet-like exposure shield having an edge portion adjacent said elongate aperture, extending along said adhesive coating from said edge portion in a first direction and thence in an opposite second direction along the other of said screen and image pattern receiving means for thence through said elongate aperture for removal through said elongate aperture of the frame.

38. An article as claimed in claim 37, wherein:
said image pattern receiving means include a pair of mutually adhesive, manually separable transparent sheets for receiving image pattern defining means.

39. An article as claimed in claim 38, including:
a removable opaque cover sheet;
said image pattern receiving means including a pair of mutually adhesive, manually separable transparent sheets between said opaque cover sheet and said sheet-like exposure shield.

40. An article as claimed in claim 34, wherein:
said image pattern receiving means include a pair of sheet-like members for receiving image pattern defining means.

41. An article of manufacture comprising in combination:
a frame having an elongate aperture;
means for providing a stencil including a screen mounted on said frame and photosensitive emulsion on said screen for selectively stopping areas of said screen upon photographic exposure and development;
sheet-like means at least partially coextensive with said screen for receiving an image pattern through which said photosensitive emulsion is to be exposed; and
means for shielding said emulsion against spurious exposure, including a sheet-like exposure shield removably disposed between said screen and said sheet-like image pattern receiving means, and extending through said elongate aperture for removal through said elongate aperture of the frame.

42. An article as claimed in claim 41, wherein:
said sheet-like exposure shield extends between said screen and said image pattern receiving means in a first direction and thence in an opposite second direction and thence through said elongate aperture for removal through said elongate aperture of the frame.

43. An article as claimed in claim 41, wherein:
at least one of said screen and image pattern receiving means has an adhesive coating for causing said image pattern receiving means to adhere to said screen upon removal of said exposure shield; and said sheet-like exposure shield has an edge portion adjacent said elongate aperture, extends along said adhesive coating from said edge portion in a first direction and thence in an opposite second direction along the other of said screen and image pattern receiving means and thence through said elongate aperture for removal through said elongate aperture of the frame.

44. An article of manufacture comprising in combination:

a frame having a frame opening;

means for providing a stencil including a screen mounted on said frame and photosensitive emulsion on said screen for selectively stopping areas of said screen upon photographic exposure and development;

sheet-like means at least partially coextensive with said screen for receiving an image pattern through which said photosensitive emulsion is to be exposed; and means for shielding said emulsion against spurious exposure, including a sheet-like exposure shield removably disposed between said screen and said sheet-like image pattern receiving means, and a sheet-like cover in said frame opening releasably connected to said frame.

45. An article of manufacture comprising in combination:

a frame;

means for providing a stencil including a screen mounted on said frame and photosensitive emulsion on said screen for selectively stopping areas of said screen upon photographic exposure and development;

a pair of mutually adhesive, manually separable transparent sheets at least partially coextensive with said screen for receiving image pattern defining means through which said phtosensitive emulsion is to be exposed; and means for shielding said emulsion against spurious exposure, including a sheet-like exposure shield removably disposed between said screen and said sheet-like image pattern receiving means.

46. An article of manufacture comprising in combination:

a housing having a slot;

means in said housing for providing a stencil, including a screen and photosensitive emulsion for selectively stopping areas of said screen upon photographic exposure and development, said stencil providing means being removable from said housing through said slot;

sheet-like means for receiving an image pattern through which said photosensitive emulsion is to be exposed, said image pattern receiving means extending through said slot for joint removal with said stencil providing means; and means connected to said stencil providing means for removing said stencil providing means from said housing and applying said stencil providing means to said image pattern receiving means.

47. An article as claimed in claim 46, wherein:
said housing has a further slot; and
said image pattern receiving means extend into said housing via said further slot.

48. An article as claimed in claim 47, wherein: said housing includes two parts separable along said slots.

49. An article as claimed in claim 47, including:
a shaft in said housing, said stencil providing means being wound on said shaft.

50. An article as claimed in claim 49, including:
a roller in said housing for facilitating removal of said wound stencil providing means from said housing.

51. In an article of manufacture for providing a stencil, the improvement comprising in combination:

a rectangular screen;

photosensitive emulsion on said screen for selectively stopping areas of said screen upon photographic exposure and development;

a first elongate screen mounting member attached to and extending along a first side of said screen and having said screen wound thereon;

a second elongate screen mounting member attached to and extending along an opposite second side of said screen; and an elongate housing for containing said wound screen and said first mounting member.

52. An article as claimed in claim 51, including:
sheet-like means for receiving an image pattern through which said photosensitive emulsion is to be exposed, said sheet-like means extending through said housing for application to said screen upon unwinding of said screen from said housing.

53. An article as claimed in claim 51, wherein:
said housing has a longitudinal slot and opposite ends, part of said wound screen extending through said longitudinal slot and said second mounting member being disposed outside said housing for an unwinding of said wound screen through said longitudinal slot; and said article includes means for mounting said elongate housing at said opposite ends.

54. An article as claimed in claim 53, wherein:
said means for mounting said elongate housing at said opposite ends includes a mounting member extending at a spacing from said elongate housing and parallel to said longitudinal slot; and said article includes sheet-like means for receiving an image pattern through which said photosensitive emulsion is to be exposed, said sheet-like means extending through said spacing for application to said screen upon unwinding of said screen from said housing.

55. An article as claimed in claim 54, including:
a protruding edge on said mounting member extending parallel to said longitudinal slot for facilitating application of said screen to said sheet-like image pattern receiving means.

56. In a method of making a stencil from a screen including photographic emulsion for selectively stopping areas of the screen upon photographic exposure and development, the improvement comprising in combination the steps of:

providing sheet-like means for receiving an image pattern through which said photosensitive emulsion is to be exposed;

shielding said photosensitive emulsion against spurious exposure;

combining said sheet-like image pattern receiving means and said screen with shielded photosensitive emulsion into a unitary stencil making assembly;

providing said image pattern receiving means with an image pattern while maintaining said photosensitive emulsion shielded against spurious exposure;

applying said sheet-like image pattern receiving means with image pattern to said screen; and subjecting said photosensitive emulsion to exposure through said image pattern and to development and removing said image pattern receiving means from said screen to provide a stencil corresponding to said image pattern;

said shielding of said photosensitive emulsion including the step of providing a removable exposure shield in said unitary stencil making assembly between said image pattern receiving means and said screen; and said application of said image pattern receiving means with said image pattern to said screen including the step of removing said exposure shield.

57. A method as claimed in claim 56, including the step of:

interconnecting said screen and said sheet-like image pattern receiving means during said combination of said sheet-like image pattern receiving means and screen into a unitary stencil making assembly.

58. A method as claimed in claim 56, wherein:

said sheet-like image pattern receiving means are provided by combining a transparent first sheet and a transparent second sheet;

said image pattern receiving means are provided with an image pattern by inserting said image pattern between said transparent first and second sheets; and said first and second sheets and inserted image pattern are applied as said sheet-like image pattern receiving means to said screen.

59. A method as claimed in claim 58, including the step of:

causing said first and second sheets releasably to adhere to each other.

60. A method as claimed in claim 56, including the step of:

initially maintaining at least a major portion of said image pattern receiving means in said unitary stencil making assembly separate from said screen.

61. A method as claimed in claim 56, including the step of:

maintaining at least a major portion of said image pattern receiving means separate from said screen in said unitary stencil making assembly until said image pattern receiving means has been provided with an image pattern.

62. A method as claimed in claim 56, including the step of:

providing said removable exposure shield with a cross-line pattern visible through said image pattern receiving means.

63. A method as claimed in claim 56, including the step of:

passing an image forming agent through said stencil to provide an image corresponding to said image pattern; and receiving said provided image.

64. In a method of making a stencil from a screen including photographic emulsion for selectively stopping areas of the screen upon photographic exposure and development, the improvement comprising in combination the steps of:

providing for said screen a sheet-like support with a frame section for mounting said screen and with a removable central section for covering one side of said screen and photographic emulsion;

providing sheet-like means for receiving an image pattern through which said photosensitive emulsion is to be exposed;

shielding said photosensitive emulsion against spurious exposure;

mounting said sheet-like image pattern receiving means in an at least partially coextensive relationship with said screen;

providing said image pattern receiving means with an image pattern while maintaining said photosensitive emulsion shielded against spurious exposure;

applying said sheet-like image pattern receiving means with image pattern to said screen;

subjecting said photosensitive emulsion to exposure through said image pattern and to development and removing said image pattern receiving means from said screen to provide a stencil corresponding to said image pattern; and removing said central section from said frame and screen after exposure of said emulsion.

65. In a method of making a stencil from a screen including photographic emulsion for selectively stopping areas of the screen upon photographic exposure and development, the improvement comprising in combination the steps of:

providing for said screen a frame structure having an elongate aperture;

mounting said screen on said frame structure; and providing sheet-like means for receiving an image pattern through which said photosensitive emulsion is to be exposed;

shielding said photosensitive emulsion against spurious exposure, including the step of providing a removable exposure shield between said image pattern receiving means and said screen;

mounting said sheet-like image pattern receiving means, said exposure shield and said screen with photosensitive emulsion in an at least partially coextensive relationship and in a unitary stencil making assembly;

providing said image pattern receiving means with an image pattern while maintaining said photosensitive emulsion shielded against spurious exposure;

removing said exposure shield through said elongate aperture in the frame structure;

applying said sheet-like image pattern receiving means with image pattern to said screen; and subjecting said photosensitive emulsion to exposure through said image pattern and to development and removing said image pattern receiving means from said screen to provide a stencil corresponding to said image pattern.

66. In a method of making a stencil from a screen including photographic emulsion for selectively stopping areas of the screen upon photographic exposure and development, the improvement comprising in combination the steps of:

providing a sheet-like support for said screen;

providing said sheet-like support with an elongate aperture;

providing sheet-like means for receiving an image pattern through which said photosensitive emulsion is to be exposed;

shielding said photosensitive emulsion against spurious exposure, including the step of providing a removable exposure shield between said image pattern receiving means and said screen;

mounting said sheet-like image pattern receiving means, said exposure shield, said sheet-like support and said screen with photosensitive emulsion in an at least partially coextensive relationship and in a unitary stencil making assembly;

providing said image pattern receiving means with an image pattern while maintaining said photosensitive emulsion shielded against spurious exposure;

removing said exposure shield through said elongate aperture in the frame structure;

applying said sheet-like image pattern receiving means with image pattern to said screen; and subjecting said photosensitive emulsion to exposure through said image pattern and to development and removing said image pattern receiving means from said screen to provide a stencil corresponding to said image pattern.

67. A method as claimed in claim 66, including the steps of:

providing said sheet-like support with a frame section for mounting said screen and with a removable central section for covering one side of said screen and photographic emulsion; and removing said central section from said frame and screen after exposure of said emulsion.

68. A method as claimed in claim 66, including the steps of:

disposing said exposure shield in said unitary stencil making assembly to extend between said screen and said image pattern receiving means in a first direction and thence in an opposite second direction; and subsequently pulling said exposure shield in said second direction until said exposure shield has been removed preparatory to exposure of said photosensitive emulsion.

69. A method as claimed in claim 68, including the step of:

causing said image pattern receiving means to adhere to said screen upon removal of said exposure shield.

70. In a method of making a stencil from a screen including photographic emulsion for selectively stopping areas of the screen upon photographic exposure and development, the improvement comprising in combination the steps of:

providing shielding means against spurious exposure including a housing for said screen with photographic emulsion;

storing said screen with photographic emulsion in said housing;

providing sheet-like means for receiving an image pattern through which said photosensitive emulsion is to be exposed;

combining said sheet-like means and said housing with stored screen and photographic emulsion into a unitary stencil making assembly;

providing said image pattern receiving means with an image pattern while maintaining said photosensitive emulsion shielded against spurious exposure;

pulling said image pattern receiving means with said provided image pattern relative to said housing and applying said sheet-like image pattern receiving means with image pattern to said screen; and subjecting said photosensitive emulsion to exposure through said image pattern and to development and removing said image pattern receiving means from said screen to provide a stencil corresponding to said image pattern.

71. A method as claimed in claim 70, wherein:

said image pattern receiving means with said provided image pattern is pulled past said housing for an application to said screen.

72. A method as claimed in claim 70, wherein:

said image pattern receiving means with said provided image pattern is pulled through said housing for an application to said screen.

73. A method as claimed in claim 70, including the step of:

causing said applied image pattern receiving means with image pattern releasably to adhere to said screen.

74. A method as claimed in claim 70, wherein:

said screen with photographic emulsion is rolled and is stored in said housing in a rolled condition;

at least a major portion of said sheet-like means for receiving an image pattern are initially stored outside of said housing;

said image pattern receiving means are provided with an image pattern while at least a major portion of said sheet-like means are located outside of said housing; and said screen with said photographic emulsion is unrolled from said housing during said pulling and said sheet-like means with provided image pattern are applied to said screen during unrolling of said screen from said housing.

75. A method as claimed in claim 74, wherein:

said image pattern receiving means with said provided image pattern are pulled past said housing during unrolling of said screen for an application of said image pattern receiving means with image pattern to said screen.

76. A method as claimed in claim 74, including the steps of:

initially locating at least a major portion of said sheet-like means for receiving an image pattern outside of said housing;

providing said image pattern receiving means with an image pattern while at least a major portion of said sheet-like means is located outside of said housing; and applying said sheet-like means with provided image pattern to said screen during unrolling of said screen from said housing.

* * * * *